(12) United States Patent
Wu et al.

(10) Patent No.: US 12,262,586 B2
(45) Date of Patent: Mar. 25, 2025

(54) ELECTRONIC DEVICE

(71) Applicant: Innolux Corporation, Miao-Li County (TW)

(72) Inventors: Irene Wu, Miao-Li County (TW); Roger Huang, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 18/654,796

(22) Filed: May 3, 2024

(65) Prior Publication Data

US 2024/0292653 A1  Aug. 29, 2024

Related U.S. Application Data

(63) Continuation of application No. 18/345,133, filed on Jun. 30, 2023, now Pat. No. 12,010,869, which is a continuation of application No. 17/330,036, filed on May 25, 2021, now Pat. No. 11,737,314.

(51) Int. Cl.
| | |
|---|---|
| *H10K 50/86* | (2023.01) |
| *G02B 5/00* | (2006.01) |
| *H10K 59/126* | (2023.01) |
| *H10K 59/65* | (2023.01) |
| *H10K 77/10* | (2023.01) |

(52) U.S. Cl.
CPC .......... *H10K 50/865* (2023.02); *G02B 5/003* (2013.01); *H10K 59/126* (2023.02); *H10K 59/65* (2023.02); *H10K 77/10* (2023.02)

(58) Field of Classification Search
CPC .... H10K 50/865; H10K 59/126; H10K 59/65; H10K 77/10; G02B 5/003
See application file for complete search history.

(56) References Cited

U.S. PATENT DOCUMENTS 11,226,511 B2 * 1/2022 Wu .................... G02F 1/133512
2021/0032156 A1 * 2/2021 Hwang .............. H10K 59/8792

* cited by examiner

*Primary Examiner* — David Vu
*Assistant Examiner* — Brandon C Fox
(74) *Attorney, Agent, or Firm* — Patterson + Sheridan, LLP

(57) ABSTRACT

An electronic device is provided. The electronic device has a first portion and a second portion adjacent to the first portion. The electronic device includes a sensing element and a plurality of first patterns and a plurality of second patterns. The sensing element is configured to receive a light corresponding to the first portion. The plurality of first patterns and the plurality of second patterns are corresponding to the second portion and configured to absorb different colors of lights. Moreover, an area of one of the plurality of first patterns is different from an area of one of the plurality of second patterns.

15 Claims, 11 Drawing Sheets

ELECTRONIC DEVICE

CROSS REFERENCE TO RELATED APPLICATIONS

This application is a Continuation of U.S. patent application Ser. No. 18/345,133, filed Jun. 30, 2023 and entitled "ELECTRONIC DEVICE", which is a Continuation of U.S. patent application Ser. No. 17/330,036, filed May 25, 2021 (now U.S. Pat. No. 11,737,314) and entitled "DISPLAY PANEL AND DISPLAY DEVICE", the entirety of which are incorporated by reference herein.

BACKGROUND

Technical Field

The present disclosure relates to a display device, and in particular, it relates to a display panel of the display device.

Description of the Related Art

Electronic devices with panels, such as displays, smartphones, tablet computers, notebook computers or televisions have become indispensable necessities in modern society. With the flourishing development of these electronic devices, consumers have high expectations regarding their quality, functionality, and price.

However, these electronic devices have not yet met consumer expectations in various aspects. For example, due to the structural design (e.g., the light shielding layer) of the panel, the signal to noise ratio (S/N ratio) of the sensing element in the electronic device may be decreased. Therefore, the development of a structural design of the electronic device that can improve the S/N ratio issue is still one of the goals in the current industry.

SUMMARY

In accordance with some embodiments of the present disclosure, an electronic device is provided. The electronic device has a first portion and a second portion adjacent to the first portion. The electronic device includes a sensing element and a plurality of first patterns and a plurality of second patterns. The sensing element is configured to receive a light corresponding to the first portion. The plurality of first patterns and the plurality of second patterns are corresponding to the second portion and configured to absorb different colors of lights. Moreover, an area of one of the plurality of first patterns is different from an area of one of the plurality of second patterns.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
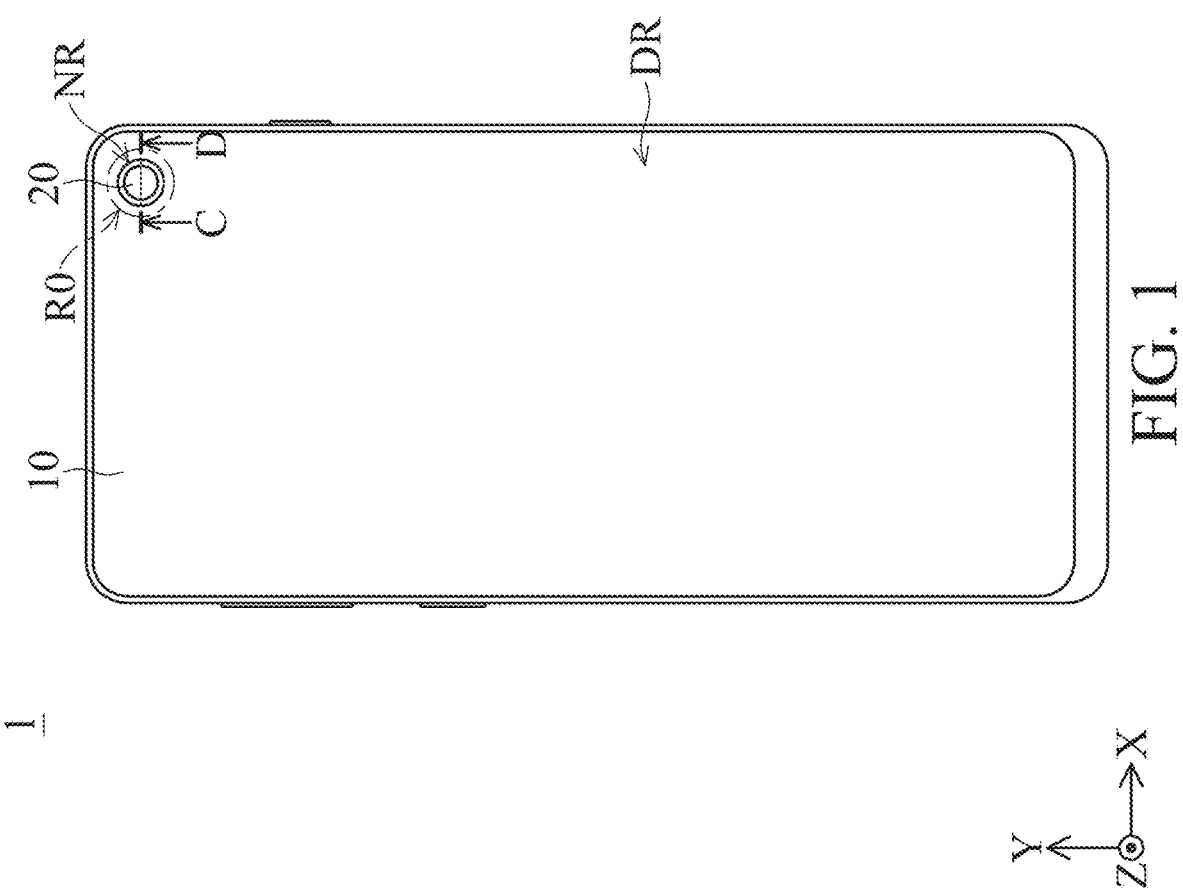
FIG. 1 is a schematic diagram of a display device in accordance with some embodiments of the present disclosure.

The display panel and display device of the present disclosure are described in detail in the following description. It should be understood that in the following detailed description, for purposes of explanation, numerous specific details and embodiments are set forth in order to provide a thorough understanding of the present disclosure. The elements and configurations described in the following detailed description are set forth in order to clearly describe the present disclosure. The embodiments are used merely for the purpose of illustration. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments.

The present disclosure can be understood by referring to the following detailed description in connection with the accompanying drawings. It should be noted that, in order to allow the reader to easily understand the drawings, several drawings in the present disclosure only depict a portion of the electronic device, and the specific elements in the drawings are not drawn to scale. In addition, the number and size of each element in the drawings are only for illustration and the scope of the present disclosure is not limited thereto.

Throughout the present disclosure and the appended claims, certain terms are used to refer to specific elements. Those skilled in the art should understand that electronic device manufacturers may refer to the same element with different names. The present disclosure does not intend to distinguish between elements that have the same function but different names. In the specification and claims, the terms "comprising", "including", "having" and the like are open-ended phrases, so they should be interpreted as "including but is not limited to . . . ". Therefore, when the terms "comprising", "including" and/or "having" are used in the description of the present disclosure, they specify the corresponding features, regions, steps, operations and/or components, but do not exclude the existence of one or more corresponding features, regions, steps, operations and/or components.

Directional terms mentioned in the present disclosure, such as "upper", "lower", "front", "rear", "left", "right", etc., are only the directions referring to the drawings. Therefore, the directional terms are used for illustration, not for limiting the scope of the present disclosure. The drawings depict general features of methods, structures, and/or materials used in particular embodiments. However, these drawings should not be interpreted as defining or limiting the scope or property encompassed by these embodiments.

For example, for clarity, the relative sizes, thicknesses, and positions of the various layers, regions, and/or structures may be reduced or enlarged.

When a corresponding component (such as a layer or region) is referred to as "(disposed or located) on another component", it may be directly (disposed or located) on another component, or there may be other components between them. On the other hand, when a component is referred to as "directly (disposed or located) on another component", there is no component existing between them. In addition, when a component is referred to as "(disposed or located) on another component", the two have an upper-lower relationship in a top-view direction, and this component may be above or below another component, and the upper-lower relationship depends on the orientation of the device.

The terms "about", "equal to", "the same as", "identical to", "substantially" or "approximately" are generally interpreted as being within 20% of a given value or range, or within 10%, 5%, 3%, 2%, 1% or 0.5% of the given value or range.

The ordinal numbers used in the specification and claims, such as the terms "first", "second", etc., are used to modify an element, which itself does not mean and represent that the element (or elements) has any previous ordinal number, and does not mean the order of a certain element and another element, or the order in the manufacturing method. The use of these ordinal numbers is used to make a component with a certain name can be clearly distinguished from another component with the same name. The same words may not be used in the claims and the specification. Accordingly, the first component in the specification may be the second component in the claims.

It should be noted that the following embodiments can replace, recombine, and combine features in several different embodiments to complete other embodiments without departing from the spirit of the present disclosure. The features between the various embodiments can be combined and used arbitrarily as long as they do not violate or conflict the spirit of the present disclosure.

In the present disclosure, the length and the width of the component can be measured from an optical microscope image, and the thickness of the component can be measured from a cross-sectional image in an electron microscope, but it is not limited thereto. In addition, certain errors may exist between any two values or directions used for comparison. If the first value is equal to the second value, it implies that there may be an 10% error between the first value and the second value; if the first direction is perpendicular to the second direction, the angle between the first direction and the second direction may be between 80 degrees and 100 degrees; if the first direction is parallel to the second direction, the angle between the first direction and the second direction may be between 0 degrees and 10 degrees.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with some embodiments of the present disclosure, a display panel and a display device including the display panel are provided. The display panel includes a plurality of light absorbing patterns disposed in the non-aperture region of the non-display region and the light absorbing patterns can absorb different colors of lights, for example, the non-target lights of various wavelengths. With the configuration of such light absorbing patterns, the non-target lights of various wavelengths reaching the sensing element in the display device can be reduced. Therefore, the signal to noise ratio performance of the sensing element in the display device can be improved.

Figure 2:
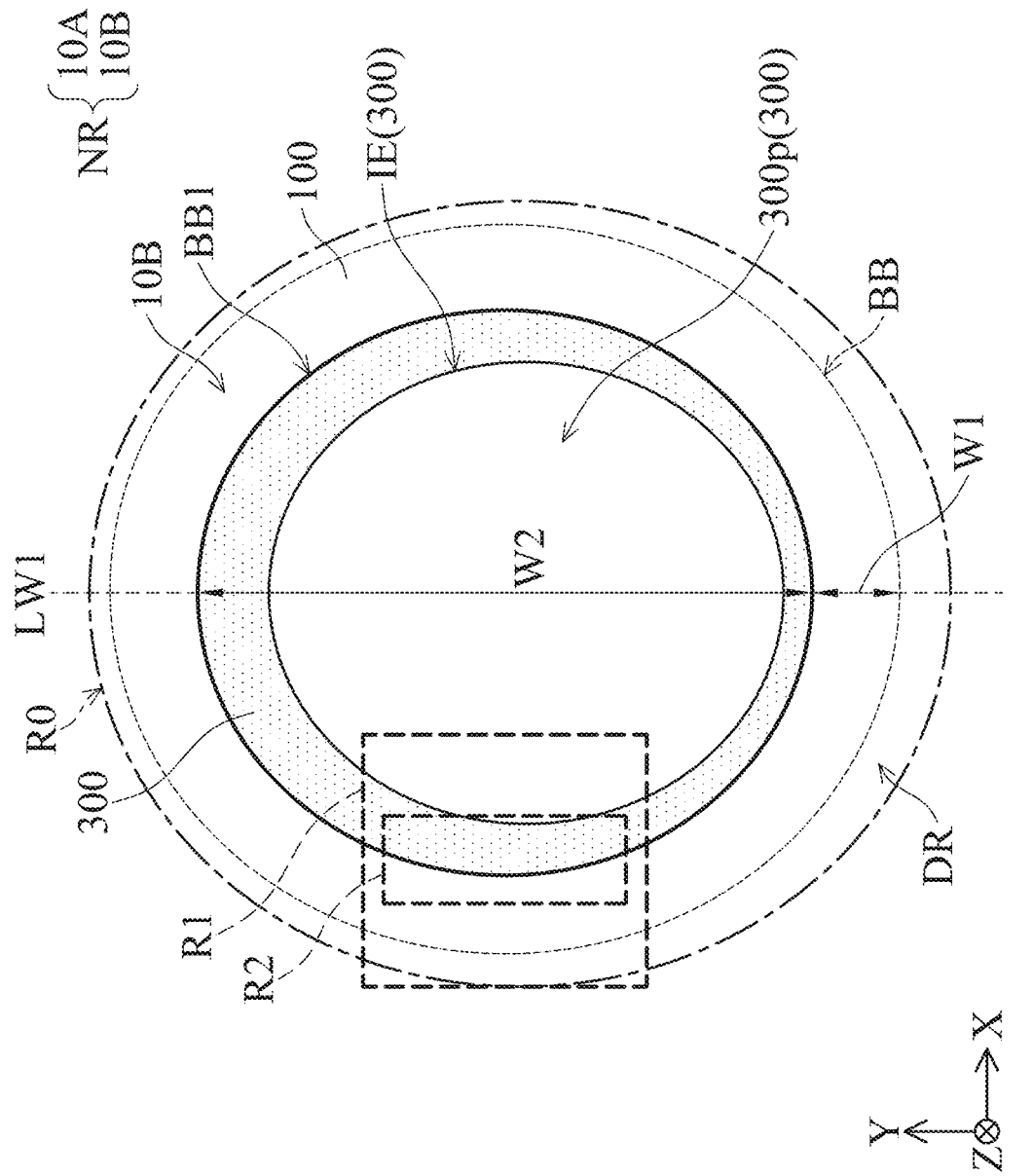
FIG. 2 is a partially enlarged schematic diagram of a display device in accordance with some embodiments of the present disclosure.
Figure 3A:
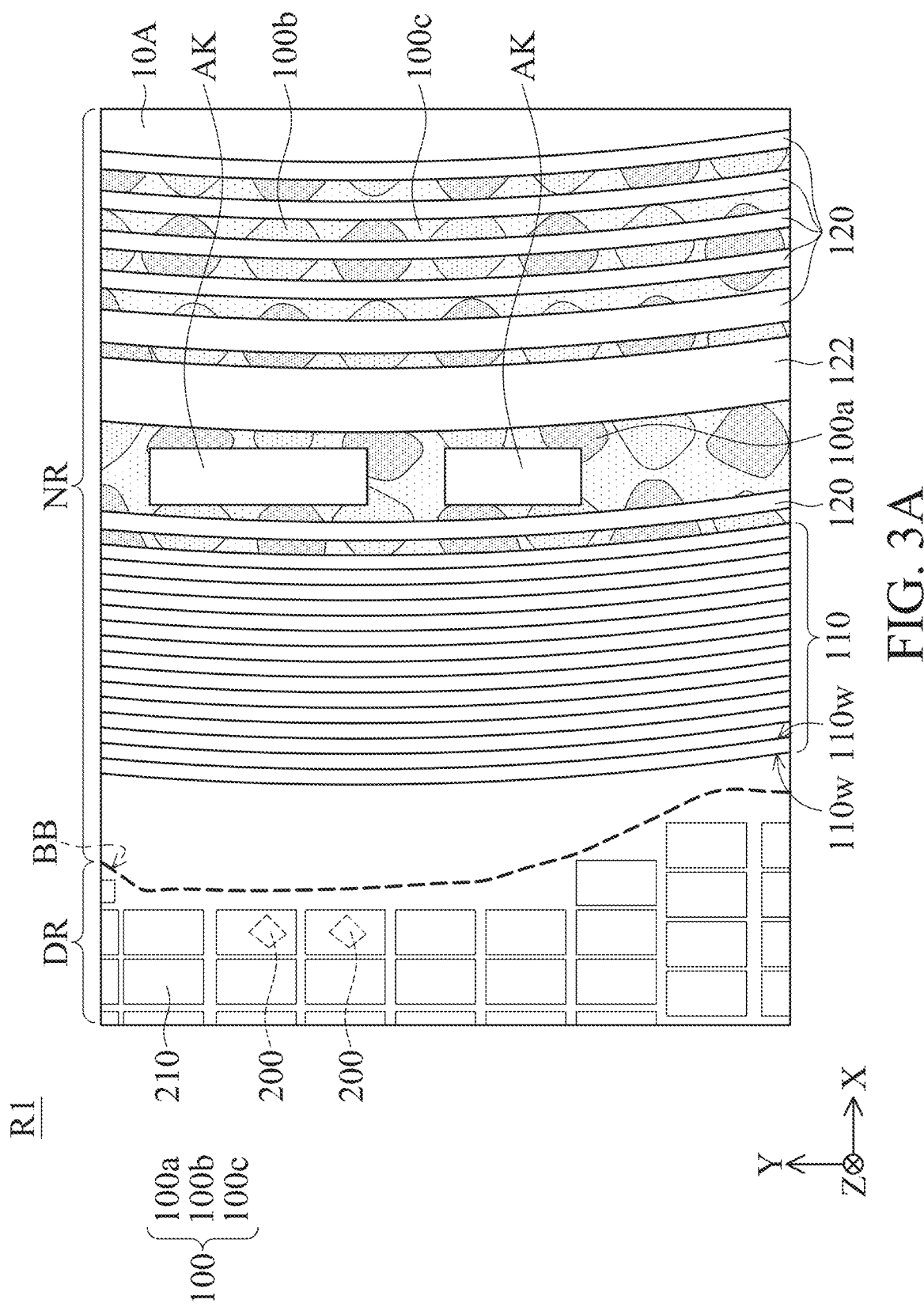
FIGS. 3A-3B are partially enlarged schematic diagrams of a display device in accordance with some embodiments of the present disclosure.

Refer to FIG. 1, FIG. 2 and FIG. 3A. FIG. 1 is a schematic diagram of a display device 1 in accordance with some embodiments of the present disclosure. FIG. 2 is a partially enlarged schematic diagram of region R0 of the display device 1 in FIG. 1 in accordance with some embodiments of the present disclosure. FIG. 2 illustrates a bottom-view schematic diagram of the display device 1 in the region R0. FIG. 3A is partially enlarged schematic diagrams of region R1 in FIG. 2 in accordance with some embodiments of the present disclosure. It should be understood that only some elements of the display device 1 are illustrated in FIG. 1, FIG. 2 and FIG. 3A for clarity. In some embodiments, additional features or elements may be optionally added to the display device 1. In some embodiments, some features of the display device 1 described below may be optionally replaced or omitted. FIG. 3A illustrates a schematic diagram of the display panel 10 in the region R1. It should be understood that FIG. 3A only illustrate a few light-emitting elements 200 to described their position for clarity, the number, shape or size of the light-emitting elements 200 are not limited to those shown in the figure.

In some embodiments, the display device 1 may include a light-emitting diode display device, such as an inorganic light-emitting diode display device, an organic light-emitting diode (OLED) display device, a mini light-emitting diode (mini LED) display device, a micro light-emitting diode (micro LED) display device, a quantum dot (QD) light-emitting diode (for example, QLED or QDLED) display device, or a combination thereof, but it is not limited thereto.

In some embodiments, the display device may be a tiled display device, bendable electronic device or a flexible electronic device, but it is not limited thereto. It should be understood that a display device is taken as an example in the following descriptions to illustrate the present disclosure, but the present disclosure is not limited thereto. In some embodiments, the display device may be equipped with other functions and/or serve as a touch device, a sensing device, an antenna device or a combination thereof, but it is not limited thereto.

As shown in FIG. 1, FIG. 2 and FIG. 3A, in some embodiments, the display device 1 may include a display panel 10 and a sensing element 20. The display panel 10 may have a display region DR and a non-display region NR, the non-display region NR may have an aperture region 10A and a non-aperture region 10B surrounding the aperture region 10A. In some embodiments, a display panel 10 includes a plurality of light-emitting elements 200 and a plurality of driving elements 210 electrically connected to the plurality light-emitting elements 200 respectively, and the plurality of light-emitting elements may emit a light (shown in FIG. 3A) for displaying images. The display region DR may be defined by a region enclosing all of the light-emitting elements 200. In other words, the plurality of light-emitting elements may be disposed in the display region DR. The non-display region NR may be defined by other region of the display panel 10 excluding the display region DR. In some embodiments, the non-display region NR may include the aperture region 10A and the non-aperture region 10B, and the sensing element 20 may be disposed corresponding to the aperture region 10A. In other words, the sensing element 20 may overlap the aperture region 10A in the normal direction Z of the display panel 100. In some embodiments, the display region DR may surround the non-display region NR. In some embodiments, the shape of the non-display region NR may be a round, a rectangular or an irregular shape, but it is not limited thereto. In some embodiments, the sensing element 20 may include a camera, a fingerprint sensor, another suitable sensing element, or a combination thereof, but it is not limited thereto.

As shown in FIG. 2 and FIG. 3A, in some embodiments, the aperture region 10A may be a through-hole via. In some embodiments (not shown), the aperture region 10A may be a blind via, the blind via may be a via that removes part of the display panel 10 but not penetrate the display panel 10. For example, at least part of a substrate 104 or at least part of a base 102 may not be removed, and the detailed description of the substrate 104 and/or the base 102 will be explained later. In some embodiments, there is a boundary BB between the non-display region NR and the display region DR, and there is a boundary BB1 between the aperture region 10A and non-aperture region 10B. When the aperture region 10A is a through-hole via, the boundary BB1 may be an outer edge of the through-hole via. In some embodiments (not illustrated), when the aperture region 10A is a blind via, the boundary BB1 may be defined by an outer edge of the blind via.

In addition, as shown in FIG. 2, the non-aperture region 10B may have a width W1, and the aperture region 10A may have a width W2. It should be understood that, when a shape of the aperture region 10A is approximately a circular shape, the width W2 of the aperture region 10A may be defined by a diameter of the circular shape. When the shape of the aperture region 10A is not a circular shape, the width W2 of the aperture region 10A may be defined by a maximum width of the aperture region 10A. Moreover, the width W1 of the non-aperture region 10B may be defined by a width along an extending line LW1 of the width W2. In some embodiments, a ratio of the width W1 of the non-aperture region 10B to a half of width W2 of the aperture region 10A may be greater than or equal to 0.1 and less than or equal to 1 (i.e. $0.1 \leq W1/(W2/2) \leq 1$), or may be greater than or equal to 0.2 and less than or equal to 0.5 (i.e. $0.2 \leq W1/(W2/2) \leq 0.5$), such as 0.25, 0.35, 0.45, but it is not limited thereto.

In some embodiments, the width W1 of the non-aperture region 10B and the width W2 of the aperture region 10A are 0.73 millimeters (mm) and 3.74 mm, respectively, but it is not limited thereto. In some embodiments, the width W1 of the non-aperture region 10B and the width W2 of the aperture region 10A are 0.46 mm and 3.22 mm, respectively, but it is not limited thereto. In some embodiments, the width W1 may be greater than or equal to 0.3 mm and less than or equal to 0.8 mm (i.e. $0.3 \text{ mm} \leq W1 \leq 0.8 \text{ mm}$), such as 0.4 mm, 0.5 mm, 0.6 mm, or 0.7 mm, but it is not limited thereto.

It should be noted that, in the embodiments, an optical microscopy (OM), a scanning electron microscope (SEM), a film thickness profiler ($\alpha$-step), an ellipsometer or another suitable methods may be used to measure the width, the length, the thickness of each element or the distance (or gap) between these elements, but it is not limited thereto. In some embodiments, a scanning electron microscope can be used to obtain any cross-sectional image including the elements to be measured, and the width, length, thickness or distance between the elements in the image can be measured.

In some embodiments, the light-emitting element 200 may include an organic light-emitting diode (OLED), but it is not limited thereto. In some embodiments, the driving element 210 may include at least one thin-film transistor, capacitance or other electrical elements. For example, the display panel 10 may include a plurality of data lines (not illustrated) and a plurality of scan lines (not illustrated) disposed in the display region DR.

As shown in FIG. 3, the display panel 10 may include the light absorbing element 100. The light absorbing element 100 may include a plurality of first light absorbing patterns 100a and a plurality of second light absorbing patterns 100b disposed in the non-aperture region 10B of the non-display region NR, and the first light absorbing patterns 100a and the second light absorbing patterns 100b may be configured to absorb different colors of lights. In some embodiments, the light absorbing element 100 may further include a plurality of third light absorbing patterns 100c disposed in the non-aperture region 10B. The first light absorbing patterns 100a, the second light absorbing patterns 100b and the third light absorbing patterns 100c may absorb different colors of lights. In other words, the first light absorbing patterns 100a may absorb a first color of light, the second light absorbing patterns 100b may absorb a second color of light, and the third light absorbing patterns 100c may absorb a third color of light, and the first color, the second color and the third color are different.

In some embodiments, the first light absorbing patterns 100a, the second light absorbing patterns 100b and/or the third light absorbing patterns 100c may include organic light-emitting diodes or other materials, but it is not limited thereto. However, the plurality of first light absorbing patterns 100a, the plurality of second light absorbing patterns 100b and the plurality of third light absorbing patterns 100c may not be electrically connected to the driving elements 210.

In some embodiments, the first light absorbing patterns 100a, the second light absorbing patterns 100b and/or the third light absorbing patterns 100c may include at least one electron transporting layer, at least one hole transporting layer, at least one electron injection layer, at least one hole injection layer, and/or at least one light-emitting layer, but it is not limited thereto.

As described above, the ratio of the width W1 of the non-aperture region 10B to a half of the width W2 of the aperture region 10A may be greater than or equal to 0.1 and less than or equal to 1. In some embodiments, the light absorbing element 100 may be disposed in the non-aperture region 10B, and the light absorbing element 100 may be formed from the boundary BB1 to the boundary BB, but it is not limited thereto. In other words, in some embodiments (not illustrated), the light absorbing element 100 may be disposed in part of the non-aperture region 10B, but it is not limited thereto.

In some embodiments, when the width W1 of the non-aperture region 10B and the half of the width W2 of the aperture region 10A are configured to be within the above range (e.g., $0.1 \leq W1/(W2/2) \leq 1$), the non-target lights (such as the non-target lights L2) of various wavelengths can be efficiently absorbed by the light absorbing element 100, and the non-target lights (such as the non-target lights L2) reaching the sensing element 20 can be reduced. Therefore, the signal to noise ratio (signal/noise) of the sensing element 20 can be improved. It should be noted that if the ratio of $W1/(W2/2)$ is too small (e.g., less than 0.1), the light absorbing effect of the light absorbing element 100 may be insufficient, and the signal to noise ratio of the sensing element 20 may be decreased; and if the ratio of W1/(W2/2) is too large (e.g., greater than 1), the area of the non-display region NR may be too large so that the display performance of the display panel 10 may be affected, or the aperture region 10A may be too small so that the sensing performance of the sensing element 20 may be affected.

As shown in FIG. 3A, in some embodiments, the plurality of first light absorbing patterns 100a, the plurality of second light absorbing patterns 100b may be arranged in a staggered manner. For example, there may be a second light absorbing pattern 100b and/or a third light absorbing pattern 100c between adjacent ones of the first absorbing patterns 100a. There may be a first light absorbing pattern 100a and/or a third light absorbing pattern 100c between adjacent ones of the second absorbing patterns 100b. In some embodiments, the first light absorbing patterns 100a, the second light absorbing patterns 100b, or the third light absorbing patterns 100c may be arranged in a repeated manner or a random manner. In some embodiments, the same type of light absorbing patterns (such as the first light absorbing patterns 100a or the second light absorbing patterns 100b) are not connected to each other.

In some embodiments, different types of light absorbing patterns are different in area. In some embodiments, an area of one of the plurality of first light absorbing patterns 100a may be different from an area of one of the plurality of second light absorbing patterns 100b and/or an area of one of the plurality of third light absorbing patterns 100c. In some embodiments, the first light absorbing patterns 100a may have same or different areas. In some embodiments, the second light absorbing patterns 100b may have same or different areas. In some embodiments, the third light absorbing patterns 100c may have same or different areas. In some embodiments, a number of the plurality of first light absorbing patterns 100a may be different from or the same as a number of the plurality of second light absorbing patterns 100b and/or a number of the plurality of third light absorbing patterns 100c. In some embodiments, the number of the plurality of first light absorbing patterns 100a may be less than the number of the plurality of second light absorbing patterns 100b, and the area of one of the plurality of first light absorbing patterns 100a may be greater than the area of one of the plurality of second light absorbing patterns 100b. In some embodiments, the first light absorbing pattern 100a, the second light absorbing pattern 100b and the third light absorbing pattern 100c may include red OLED martials, green OLED martials, blue OLED martials respectively, but it is not limited thereto.

In some embodiments, an area of the light absorbing element 100 may be greater than or equal to 1000 μm$^2$ and less than or equal to 3000 μm$^2$ (i.e. 1000 μm$^2$≤an area of the light absorbing element 100≤3000 μm$^2$), such as 1500 μm$^2$, 2000 μm$^2$, or 2500 μm$^2$, but it is not limited thereto.

Furthermore, referring to FIG. 3A, the display panel 10 may further include a conductive structure 110 disposed in the non-display region NR. The conductive structure 110 (including a plurality of wires 110w) may overlap part of the light absorbing element 100 in the normal direction Z of the display panel 100. In some embodiments, the wires 110w may be configured to transfer the signals to the light-emitting elements 200, but it is not limited thereto. In some embodiments, the wires 110w may include conductive material, such as a metal conductive material, a transparent conductive material, or a combination thereof.

Figure 4A:
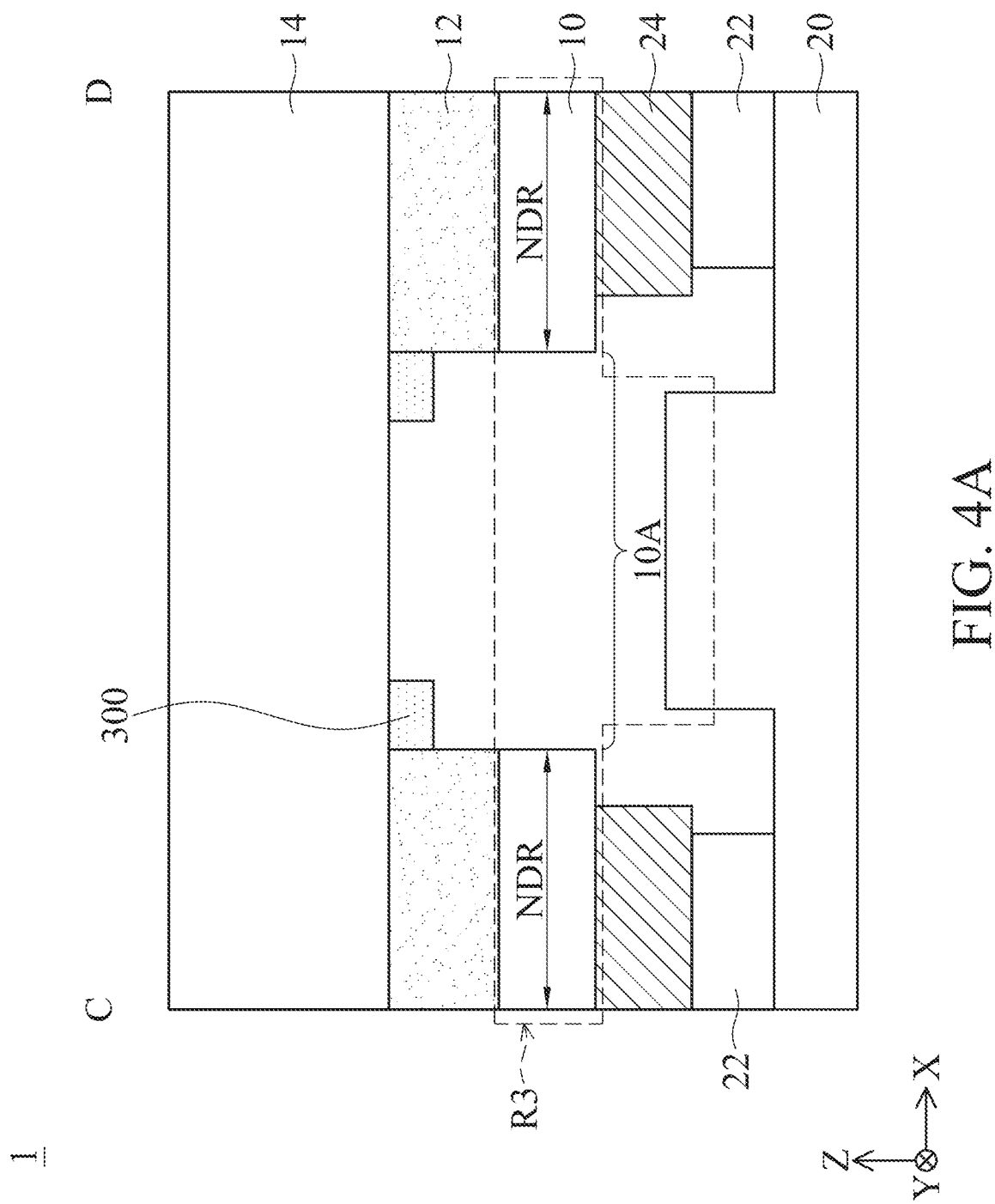
FIGS. 4A-4B are schematic cross-sectional diagrams of a display device taken along section line C-D in FIG. 1 in accordance with some embodiments of the present disclosure.
Figure 4B:
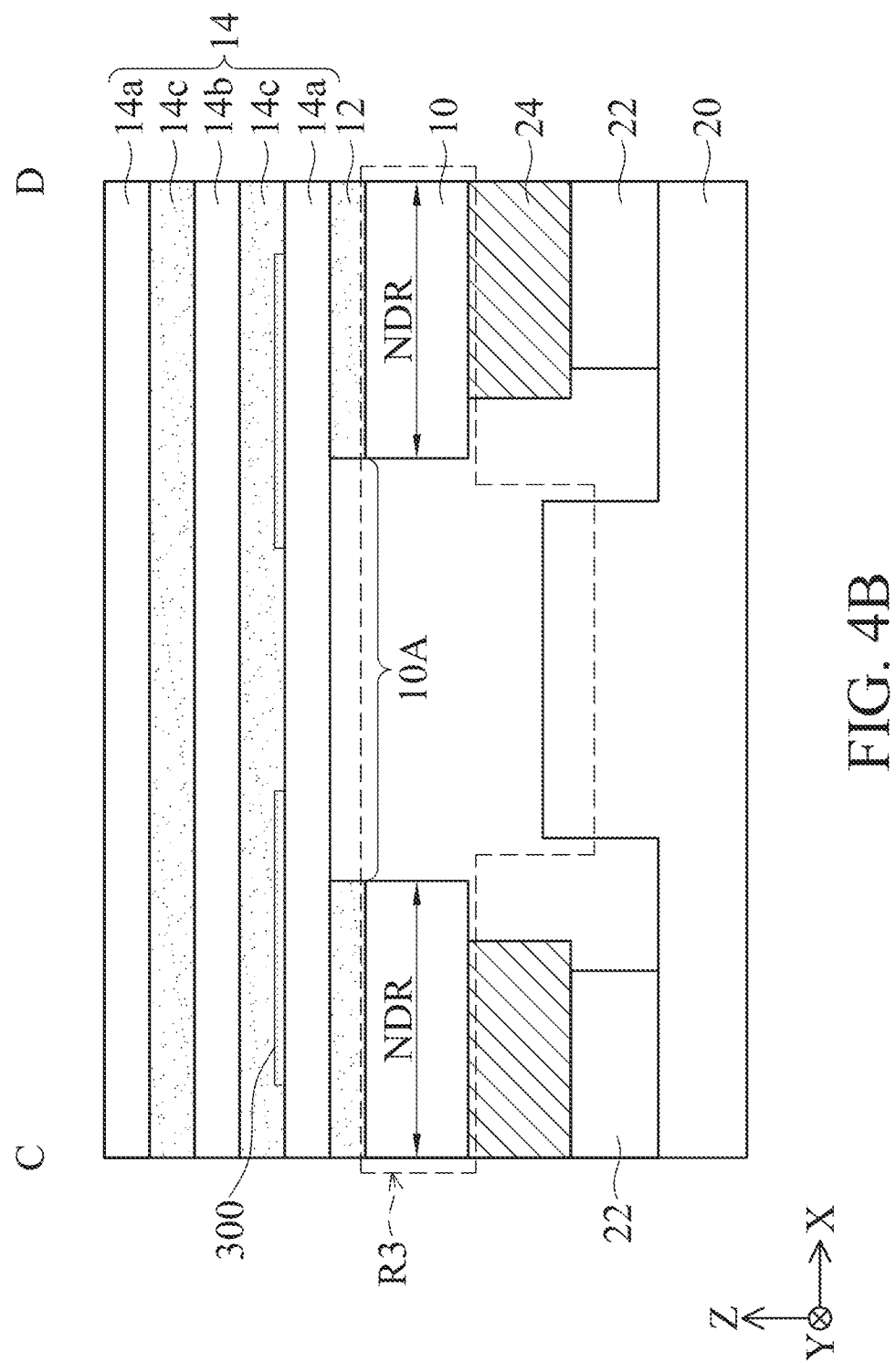
Figure 5A:
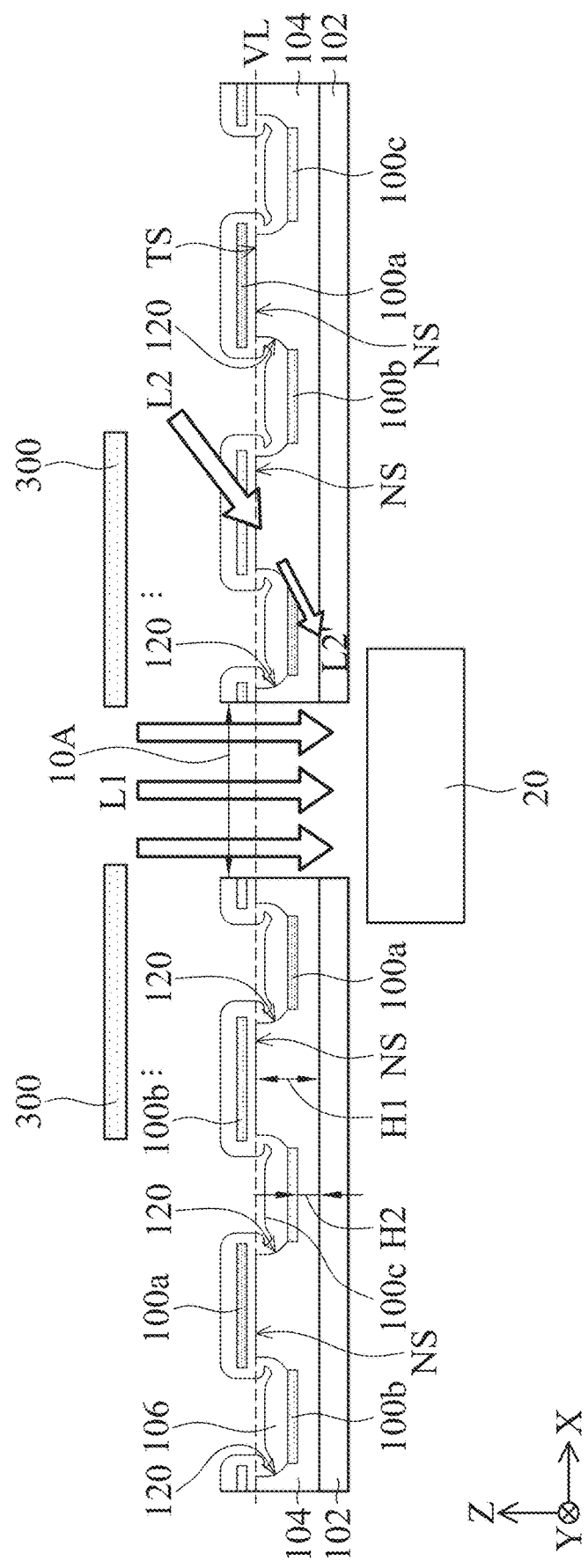
FIGS. 5A-5C are partially enlarged schematic cross-sectional diagrams in region R3 of a display device in FIGS. 4A-4B in accordance with some embodiments of the present disclosure.
Figure 5B:
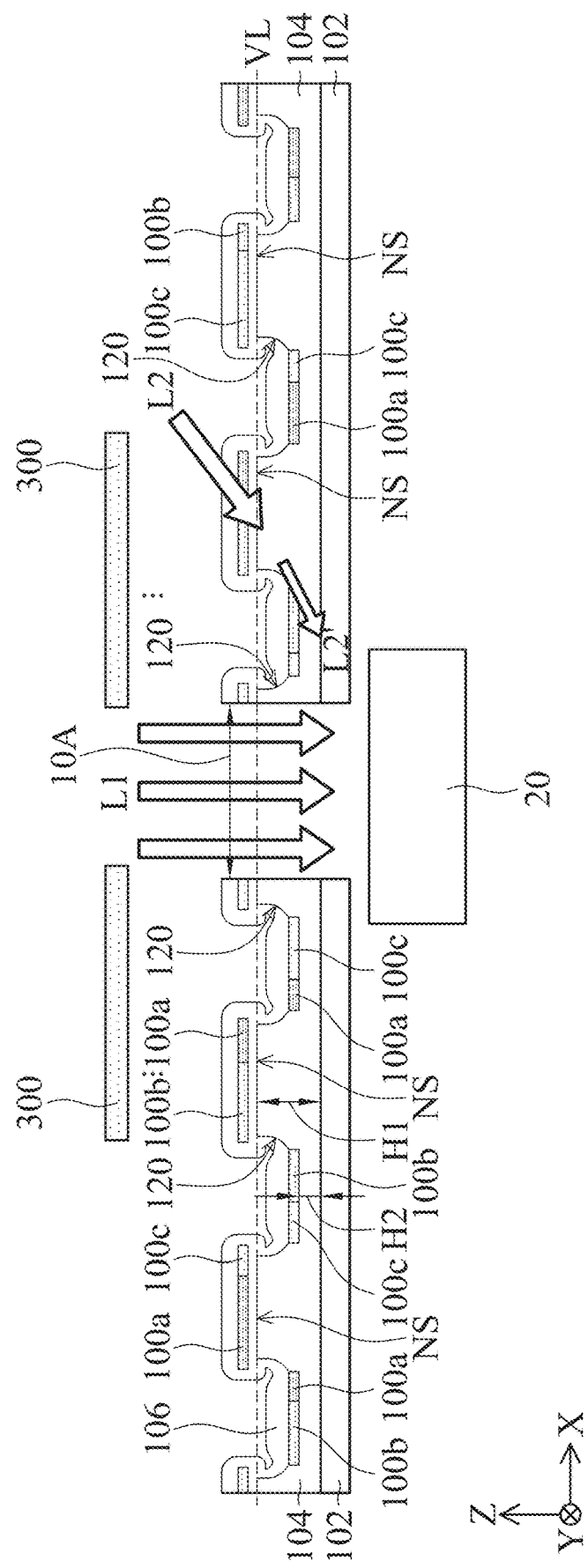
Figure 5C:
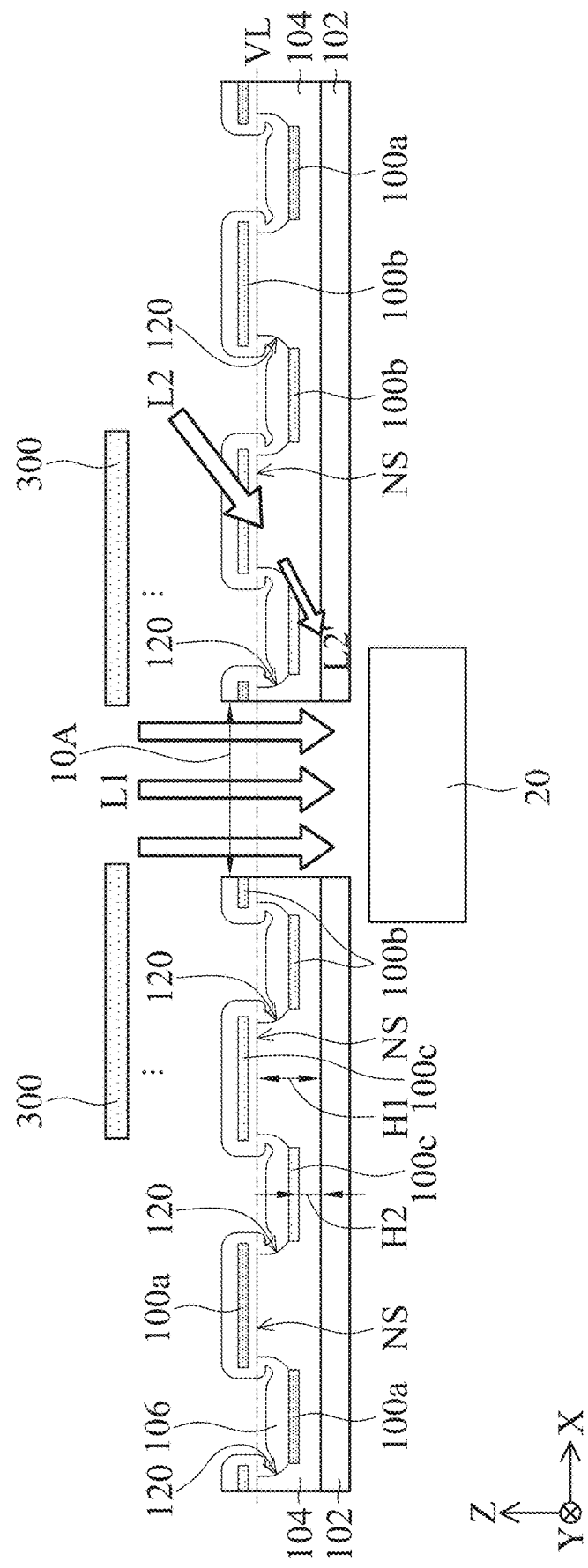

Refer to FIG. 3A, FIG. 4B and FIG. 5A-5C. FIG. 4B is schematic cross-sectional diagrams of a display device 1 taken along section line C-D in FIG. 1 in accordance with some embodiments of the present disclosure. FIGS. 5A-5C are partially enlarged schematic cross-sectional diagrams in a region R3 of the display device 1 in FIG. 4B in some embodiments of the present disclosure. It should be understood that only some elements of the display device 1 are illustrated in FIG. 3A, FIG. 4B and FIGS. 5A-5C for clarity. In some embodiments, the display device 1 may include a base 102 and a substrate 104 disposed on the base 102, and the substrate 104 may include a plurality of slits 120 disposed in the non-display region NR. The substrate 104 may have a planer surface TS away from the base 102, the planer surface TS may have an extending virtual line VL, and the slits 120 of the substrate 104 may be defined by the parts of the substrate 104 relatively concave to the extending virtual line VL, and the slits 120 do not penetrate through the substrate 104.

In some embodiments, the base 102 may include polyimide (PI), but it is not limited thereto. In some embodiments, the substrate 104 may include polyimide (PI), but it is not limited thereto. In some embodiments, an insulating layer (not illustrated, such as SiOx, but it is not limited thereto) may be disposed between the base 102 and the substrate 104.

As shown in FIG. 3A, in some embodiments, the plurality of slits 120 may be disposed in the non-display region NR and surrounding the aperture region 10A. In some embodiments, the display panel 10 may include a dam structure 122 disposed in the non-display region NR. In some embodiments, the dam structure 122 may be disposed between two adjacent ones of the slits 120. In some embodiments, the slits 120 and/or the dam structure 122 may protect the display region DR and reduce the risk of water vapor or oxygen from entering the display region DR. The slits 120 and/or the dam structure 122 may overlap part of the light absorbing element 100 (including the first light absorbing patterns 100a, the second light absorbing patterns 100b and/or the third light absorbing patterns 100c) in the normal direction Z of the display panel 10. In some embodiments, a part of the light absorbing element 100 (including part of the plurality of first light absorbing patterns 100a, part of the plurality of second light absorbing patterns 100b and/or part of the plurality of third light absorbing patterns 100c) may be disposed in the plurality of slits 120.

In some embodiments, the first light absorbing patterns 100a, the second light absorbing patterns 100b and/or the third light absorbing patterns 100c may overlap the same as slit in the normal direction Z of the display panel 10. In other words, the first light absorbing patterns 100a, the second light absorbing patterns 100b and/or the third light absorbing patterns 100c may disposed in the same slit. In some embodiments, one first light absorbing pattern 100a, and/or one second light absorbing pattern 100b may overlap at least two of the slits in the normal direction Z of the display panel 100.

In some embodiments, the display panel 10 may further include an alignment key AK. The alignment key AK may be disposed in the non-display region NR. In some embodiments, the alignment key AK may be disposed between the conductive structure 110 and one of the slits 120. In some embodiments, the alignment key AK may be disposed between the conductive structure 110 and the dam structure 122. In some embodiments, the alignment key AK may overlap the light absorbing element 100 in the normal direction Z of the display panel 10.

Figure 3B:
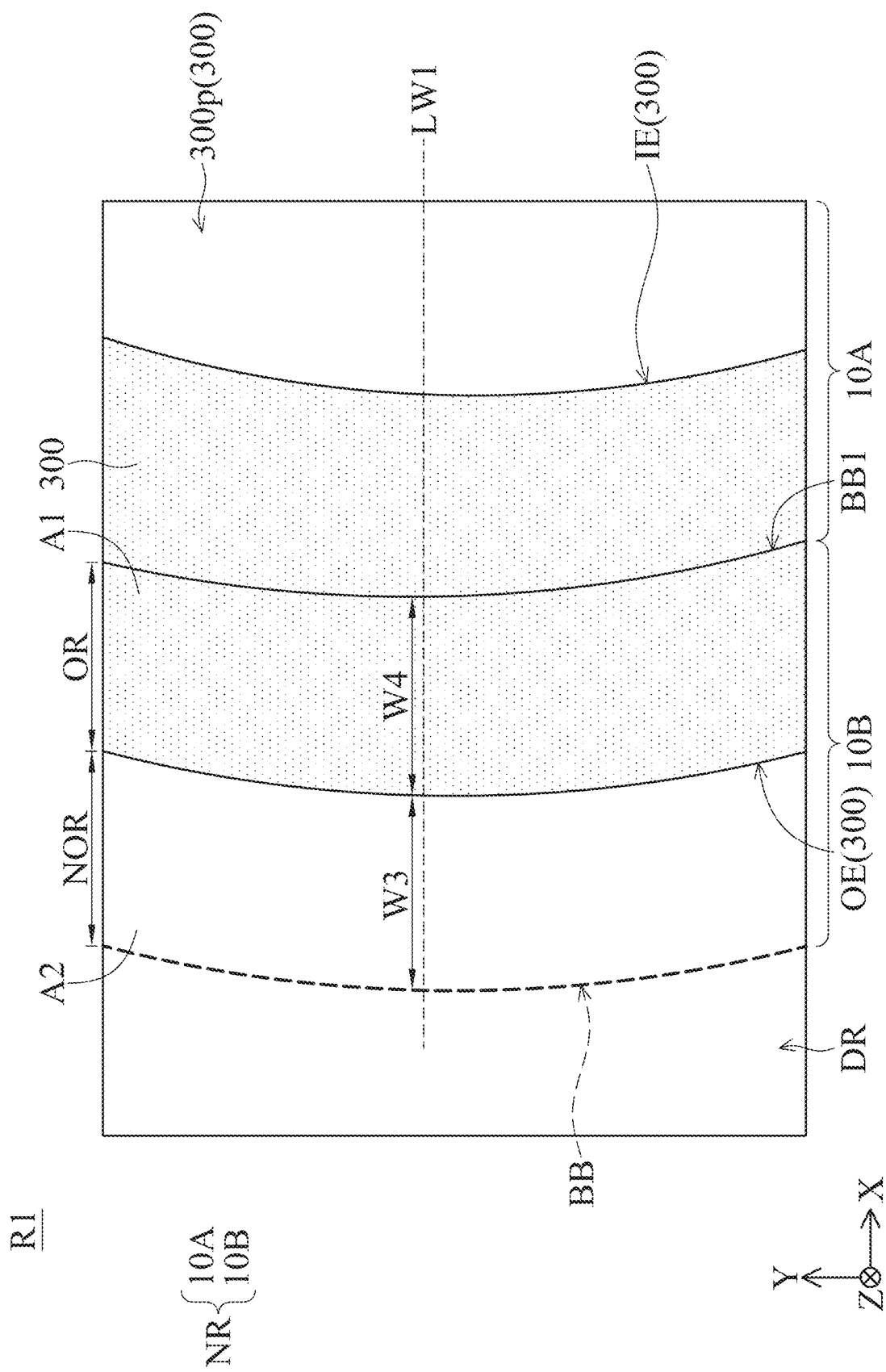

As shown in FIG. 2 and FIG. 3B, in some embodiments, the display panel 10 may further include the light shielding layer 300 with a ring shape overlapping a part of the aperture region 10A and/or at least a part of the non-aperture region 10B. For example, the light shielding layer 300 may have an aperture 300p to form the ring shape. In some embodiments, the aperture 300p of the light shielding layer 300 may overlap the aperture region 10A in the normal direction Z of the display panel 10. It should be noted that although both the aperture 300p and the aperture region 10A have a circular shape in the embodiments shown in the figure, the present disclosure is not limited thereto. The aperture 300p and/or the aperture region 10A may have any suitable shape (for example, ellipse, triangle, square, irregular shape etc.) according to needs in various embodiments.

FIG. 3B is partially enlarged schematic diagram of a display device in accordance with some embodiments of the present disclosure.

As shown in FIG. 3B, the non-aperture region 10B has an overlapping region OR and a non-overlapping region NOR. The overlapping region OR may be defined by a region that the light shielding layer 300 overlaps the non-aperture region 10B, the non-overlapping region NOR may be defined by a region that the light shielding layer 300 does not overlap the non-aperture region 10B in the normal direction Z of the display panel 100. The non-overlapping region NOR may have a width W3, and the overlapping region OR may have a width W4. In some embodiments, the width W3 of the non-overlapping region NOR may be greater than or equal to 100 mm and less than or equal to 400 mm (100 mm≤W3≤400 mm), but it is not limited thereto. In some embodiments, the width W3 of the non-overlapping region NOR may be greater than or equal to 200 mm and less than or equal to 300 mm (200 mm≤W3≤300 mm), In some embodiments, the width W4 of the overlapping region OR may be greater than or equal to 100 mm and less than or equal to 700 mm (100 mm≤W4≤700 mm), but it is not limited thereto. In some embodiments, the width W4 of the overlapping region OR may be greater than or equal to 100 mm and less than or equal to 500 mm (100 mm≤W4≤500 mm), but it is not limited thereto.

In some embodiments, a ratio of the width W4 of the overlapping region OR that the light shielding layer 300 overlaps the non-aperture region 10B to the width W1 of the non-aperture region 10B may be greater than or equal to 0.1 and less than or equal to 1 (i.e. 0.1≤W4/W1≤1), or greater than or equal to 0.2 and less than or equal to 0.8 (i.e. 0.2≤W4/W1≤0.8), such as 0.4, 0.5, 0.6, or 0.7, but it is not limited thereto.

In some embodiments, a ratio of the width W3 of the non-overlapping region NOR to the width W1 of the non-aperture region 10B may be greater than or equal to 0.2 and less than or equal to 0.6 (i.e. 0.2≤W3/W1≤0.6), or greater than or equal to 0.3 and less than or equal to 0.5 (i.e. 0.3≤W3/W1≤0.5), such as 0.35 or 0.45, but it is not limited thereto. In some embodiments, the width W3 of the non-overlapping region NOR and the width W1 of the non-aperture region 10B may be 0.23 mm and 0.73 mm, respectively, and the ratio of the width W3 to the width W1 is 0.31, but it is not limited thereto. In some embodiments, the width W3 of the non-overlapping region NOR and the width W1 of the non-aperture region 10B may be 0.25 mm and 0.46 mm, respectively, and the ratio of the width W3 to the width W1 is 0.53, but it is not limited thereto.

It should be understood that, the width W3 of the non-overlapping region NOR may be defined by a width of the non-overlapping region NOR along the extending line LW1. It should be understood that, the width W4 of the overlapping region OR may be defined by a width of the overlapping region OR along the extending line LW1.

As shown in FIG. 3B, in some embodiments, the light shielding layer 300 has an outer edge OE and an inner edge IE. In some embodiments, a ratio of an area A1 of the overlapping region OR that the light shielding layer 300 overlaps the non-aperture region 10B to an area A2 of the non-aperture region 10B may be greater than or equal to 0.1 and less than or equal to 1 (i.e. 0.1≤A1/A2≤1), or greater than or equal to 0.3 and less than or equal to 0.8 (i.e. 0.3≤A1/A2≤0.8), such as 0.4, 0.5, 0.6, or 0.7, but it is not limited thereto. In some embodiments, the area A1 of the overlapping region OR and the area A2 of the non-aperature region 10B may be 6.78 mm$^2$ and 10.32 mm$^2$, respectively, and the ratio of the area A1 to the area A2 may be 0.66. In some embodiments, the area A1 of the overlapping region OR and the area A2 of the non-aperture region 10B may be 2.35 mm$^2$ and 5.36 mm$^2$, respectively, and the ratio of the area A1 to the area A2 may be 0.44, but it is not limited thereto. In some embodiments, the area A1 of the overlapping region OR may be greater than or equal to 1 mm$^2$ and less than or equal to 8 mm$^2$ (i.e. 1 mm$^2$≤A1≤8 mm$^2$)

It should be noted that, when the width W1 of the non-aperture region 10B and the width W4 of the overlapping region OR are configured to be within the above range (e.g., 0.1≤W4/W1≤1), or the ratio of the area A1 of the overlapping region OR to the area A2 of the non-aperture region 10B are configured to be within the above range (e.g., 0.1≤A1/A2≤1), the non-target lights (such as the non-target lights L2) of various wavelengths can be efficiently absorbed by the light absorbing element 100 disposed in the non-aperture region 10B, and the non-target lights (such as the non-target lights L2) reaching the sensing element 20 can be reduced. Therefore, the signal to noise ratio of the sensing element 20 may be improved. On the other hand, if the ratio of W4/W1 or the ratio of A1/A2 is too small, the light absorbing effect of the light absorbing element 100 may be insufficient, or the signal to noise ratio of the sensing element 20 may be decreased; and if the ratio of W4/W1 or the ratio of A1/A2 is too large, the light shielding layer 300 may shield the display region DR to effect the display performance of the display panel 10.

As shown in FIG. 3B, the non-overlapping region NOR may be disposed between the overlapping region OR and the display region DR. In some embodiments, the width W3 of the non-overlapping region NOR may be greater than or equal to 200 μm and less than or equal to 300 μm (i.e. 200 μm≤W3≤300 μm), such as 210 μm, 220 μm, 230 μm, 240 μm, 250 μm, 260 μm, 270 μm, 280 μm, or 290 μm, but it is not limited thereto. The width W3 of the non-overlapping region NOR may provide a buffer for alignment, e.g., the alignment of the aperture 300p of the light shielding layer 300 and the aperture region 10A. When the width W3 of the non-overlapping region NOR is configured to be within the above range (e.g., 200 μm≤W3≤300 μm), the display region DR may be less affected by the shifting of the light shielding layer 300 due to alignment.

Next, refer to FIG. 4A, which is a schematic cross-sectional diagram of the display device 1 taken along section line C-D in FIG. 1 in some embodiments. As shown in FIG. 4A, the display device 1 may include the display panel 10 and the sensing element 20, and the sensing element 20 may be disposed corresponding to or overlap the aperture region 10A of the display panel 10 in the normal direction Z of the display panel 10. In some embodiments, the sensing element 20 may overlap at least part of the non-display region NR in the normal direction Z of the display panel 10.

In some embodiments, the display device 1 may further include a buffer element 22 and/or a conductive element 24 disposed between the sensing element 20 and the display panel 10. The buffer element 22 may provide buffer when the display panel 10 is assembled with the sensing element 20. The conductive element 24 may provide electrical connection between the display panel 10 and the sensing element 20, but it is not limited thereto.

In some embodiments, the buffer element 22 may include a sponge, a resin, another suitable buffer element, or a combination thereof, but it is not limited thereto. The conductive element 24 may include a conductive material. The conductive material may include, but is not limited to, a metal conductive material, a transparent conductive material or a combination thereof.

Referring to FIG. 4A, in some embodiments, the display device 1 may further include an adhesive element 12 and/or a cover layer 14 disposed on the display panel 10 and/or the sensing element 20. The adhesive element 12 may be disposed between the display panel 10 and the cover layer 14, the adhesive element 12 may fix the display panel 10 and the cover layer 14 together, but it is not limited thereto. In some embodiments, the light shielding layer 300 may be disposed adjacent to the adhesive element 12 and/or in contact with the adhesive element 12. In some embodiments (not illustrated in FIG. 4A), part of the light shielding layer 300 may overlap the adhesive element 12 (or the display panel 10) in the normal direction Z of the display panel 10. In some embodiments, part of the light shielding layer 300 may be disposed in the aperture region 10A. In some embodiments, the light shielding layer 300 may be disposed on the bottom surface (a surface facing the sensing element 20) of the cover layer 14 and in contact with the cover layer 14, but it is not limited thereto.

In some embodiments, the adhesive element 12 may include a photo-curable adhesive, a photo-thermal-curable adhesive, an optical clear adhesive (OCA), an optical clear resin (OCR), a glass frit, another suitable adhesive material or a combination thereof, but it is not limited. In some embodiments, the cover layer 14 may include, but is not limited to, glass, quartz, sapphire, ceramic, polyimide (PI), polycarbonate (PC), polyethylene terephthalate (PET), polypropylene (PP), another suitable material, or a combination thereof. In some embodiments, the cover layer 14 may have a single layer structure or multiple layer structure.

Refer to FIG. 4B, which is a schematic cross-sectional diagram of the display device 1 taken along section line C-D in FIG. 1 in accordance with some other embodiments of the present disclosure. It should be understood that, the same or similar components (or elements) in the following paragraph will be denoted by the same or similar reference numbers, and their materials, manufacturing methods and functions are the same or similar to those described above, and thus they will not be repeated in the following context.

As shown in FIG. 4B, in some embodiments, the cover layer 14 may have a multi-layer structure. Specifically, in some embodiments, the cover layer 14 may include first substrate layers 14a, a second substrate layer 14b and/or adhesive layers 14c. In some embodiments, the cover layer 14 may include at least two substrate layers (such as two first substrate layers 14a and one second substrate layer 14b), but it is not limited thereto. The adhesive layer 14c may be disposed between the first substrate layer 14a and the second substrate layer 14b to fix them together. In some embodiments, the light shielding layer 300 may be disposed between any one of the first substrate layers 14a and the adhesive layer 14c. In some embodiments (not illustrated), the light shielding layer 300 may be disposed between the second substrate layer 14b and the adhesive layer 14c. In some embodiments, part of the light shielding layer 300 may overlap the aperture region 10A, and/or other part of the light shielding layer 300 may overlap the non-display region NR. In some embodiments, the first substrate layer 14a may include, but is not limited to, polyethylene terephthalate (PET), polyimide (PI), polycarbonate (PC), polypropylene (PP), another suitable material, or a combination thereof. In some embodiments, the second substrate layer 14b may include, but is not limited to, glass, quartz, sapphire, ceramic, another suitable material, or a combination thereof. The material of the adhesive layer 14c may be the same as or similar to the material of the adhesive element 12, and thus will not be repeated herein.

Next, refer to FIGS. 5A-5C, the FIGS. 5A-5C are partially enlarged schematic cross-sectional diagrams in a region R3 of the display device 1 in FIG. 4B. In some embodiments, as mentioned above, the display device 1 may include the base 102 and/or the substrate 104, and the substrate 104 may have the slits 120. In some embodiments, the slits 120 may surround the aperture region 10A. In some embodiments, there are the non-slit portions NS between adjacent ones of the slits 120 respectively, and the width of the non-slit portions NS may be the same of different.

In some embodiments, part of the first light absorbing patterns 100a, part of the second light absorbing patterns 100b and/or part of the third light absorbing patterns 100c may be disposed on the substrate 104. In some embodiments, part of the plurality of first light absorbing patterns 100a, part of the plurality of second light absorbing patterns 100b and/or part of the plurality of third light absorbing patterns 100c may be disposed in the plurality of slits 120. In some embodiments, the substrate 104 further comprises a plurality of non-slit portions NS disposed between adjacent ones of the plurality of slits 120 respectively, and other part of the plurality of first light absorbing patterns 100a, other part of the plurality of second light absorbing patterns 100b and/or other part of the plurality of third light absorbing patterns 100c may be disposed on the plurality of non-slit portions NS. In some embodiments, an encapsulating layer 106 may be disposed on the substrate 104, the first light absorbing patterns 100a, the second light absorbing patterns 100b and/or the third light absorbing patterns 100c. In some embodiments, the encapsulating layer 106 may cover at least part of the substrate 104, the first light absorbing patterns 100a, the second light absorbing patterns 100b and/or the third light absorbing patterns 100c.

In some embodiments, as shown in FIG. 5A, the first light absorbing patterns 100a, the second light absorbing patterns 100b and/or the third light absorbing patterns 100c may be alternately disposed in the slits 120, but it is not limited thereto.

As shown in FIG. 5B, in some embodiments, different types of absorbing patterns (at least two types of absorbing patterns) may be disposed in the same slit 120.

In some embodiments, refer to FIG. 3A, different types of absorbing patterns (at least two types of absorbing patterns) may overlap the same slit 120 in the normal direction Z of the display panel 100. For example, in some embodiments, part of the first light absorbing pattern 100a and part of the second light absorbing pattern 100b may overlap the same slit 120 in the normal direction Z of the display panel 100, but it is not limited thereto. In some embodiments, part of the first light absorbing pattern 100a and part of the third light absorbing pattern 100c may overlap the same slit 120 in the normal direction Z of the display panel 100, but it is not limited thereto. In some embodiments, part of the second light absorbing pattern 100b and part of the third light absorbing pattern 100c may overlap the same slit 120 in the normal direction Z of the display panel 100, but it is not limited thereto.

As shown in FIG. 5C, part of one of the first light absorbing patterns 100a may be disposed in the slit 120 and other part of the one of the first light absorbing patterns 100a may be disposed on the non-slit portion NS adjacent to the slit 120. Similarly, part of one of the second light absorbing patterns 100b may be disposed in the slit 120 and other part of the one of the second light absorbing patterns 100b may be disposed on the non-slit portion NS adjacent to the slit 120. Similarly, part of one of the third light absorbing patterns 100c may be disposed in the slit 120 and other part of the one of the third light absorbing patterns 100c may be disposed on the non-slit portion NS adjacent to the slit 120. In some embodiments, one of the first light absorbing pattern 100a, one of the second light absorbing pattern 100b, and/or one of the third light absorbing patterns 100c may extend in several slits 120 and/or extend on several non-slit portions NS.

In some embodiments, one of the first light absorbing patterns 100a, one of the second light absorbing patterns 100b and/or one of the third light absorbing patterns 100c may respectively have different portions at different heights. For example, as shown in FIGS. 5A-5C, the substrate 104 may have the slits 120 and the non-slit portions NS, one of the slits 120 has a minimum height H2, and one of the non-slit portions NS has a maximum height H1, As described in FIG. 5A-5C above, part of one of the first light absorbing patterns 100a may be disposed in the slit 120 and other part of the one of the first light absorbing patterns 100a may be disposed on the non-slit portion NS, so the first light absorbing pattern 100a may have different portions at different heights. Similarly, part of one of the second light absorbing patterns 100b may be disposed in the slit 120 and other part of the one of the second light absorbing patterns 100b may be disposed on the non-slit portion NS, so the second light absorbing pattern 100b may have different portions at different heights. Similarly, part of one of the third light absorbing patterns 100c may be disposed in the slit 120 and other part of the one of the third light absorbing patterns 100c may be disposed on the non-slit portion NS, so the third light absorbing pattern 100c may have different portions at different heights.

The height difference of the maximum height H1 and the minimum height H2 may be greater than or equal to 1 μm and less than or equal to 5 μm (1 μm≤(H1−H2)≤5 μm), such as 2 μm, 3 μm, or 4 μm, but it is not limited thereto.

Moreover, it should be noted that, the light absorbing patterns having different portions at different heights can increase the chance of the non-target lights (such as the non-target lights L2) being absorbed, and the non-target lights (such as the non-target lights L2) reaching the sensing element 20 can be reduced. For example, as shown in FIGS. 5A-5C, a target light L1 can easily reach the sensing element 20, and a non-target light L2 may be reduced to non-target light L2' after being absorbed by the light absorbing patterns having different portions at different heights. The target lights L1 may be the lights that irradiate to the sensing element 20 through the aperture region 10A, and the non-target lights may be other lights excluding the target lights L1.

Figure 6A:
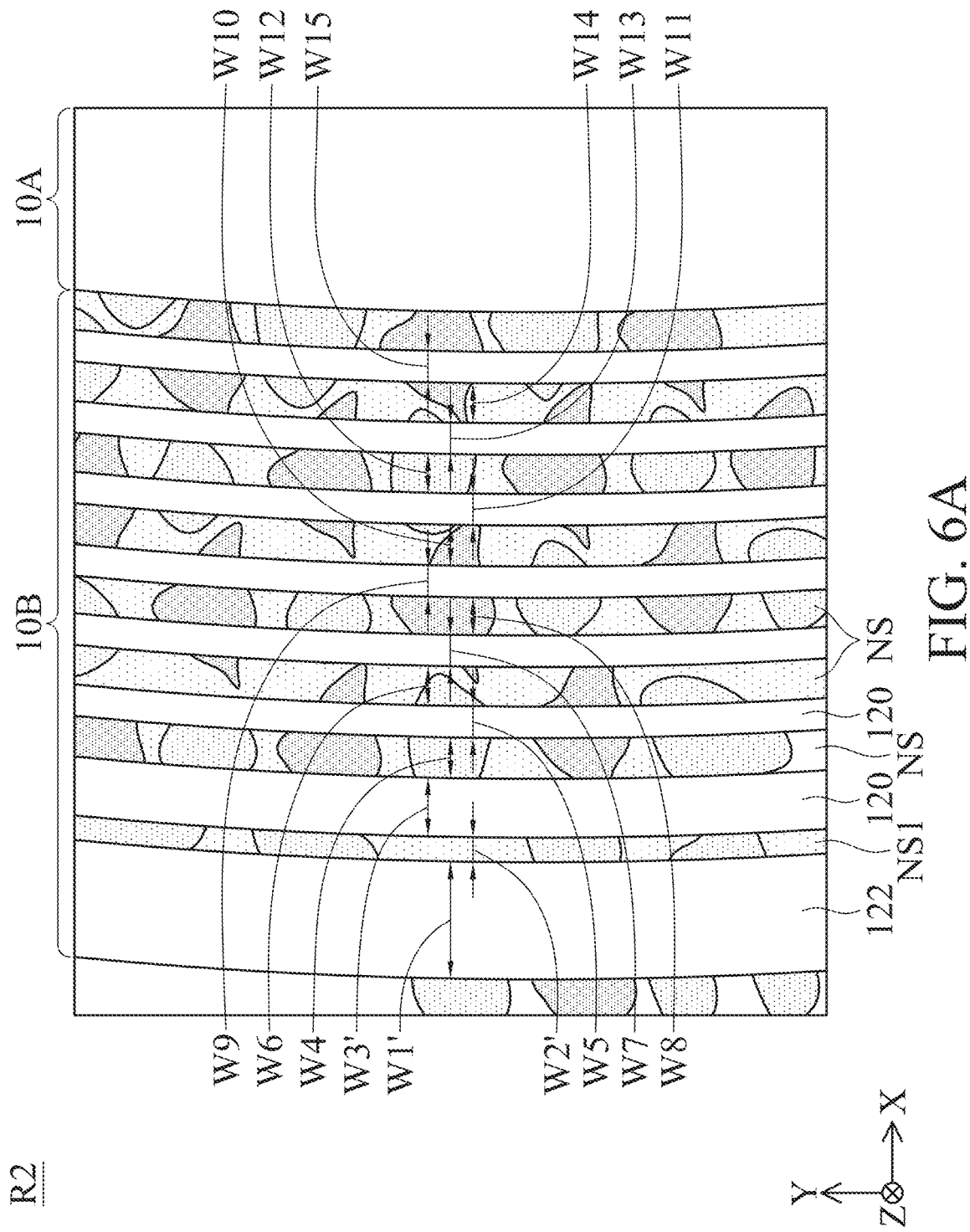
FIGS. 6A-6B are partially enlarged schematic diagrams of a display device in accordance with some embodiments of the present disclosure.
Figure 6B:
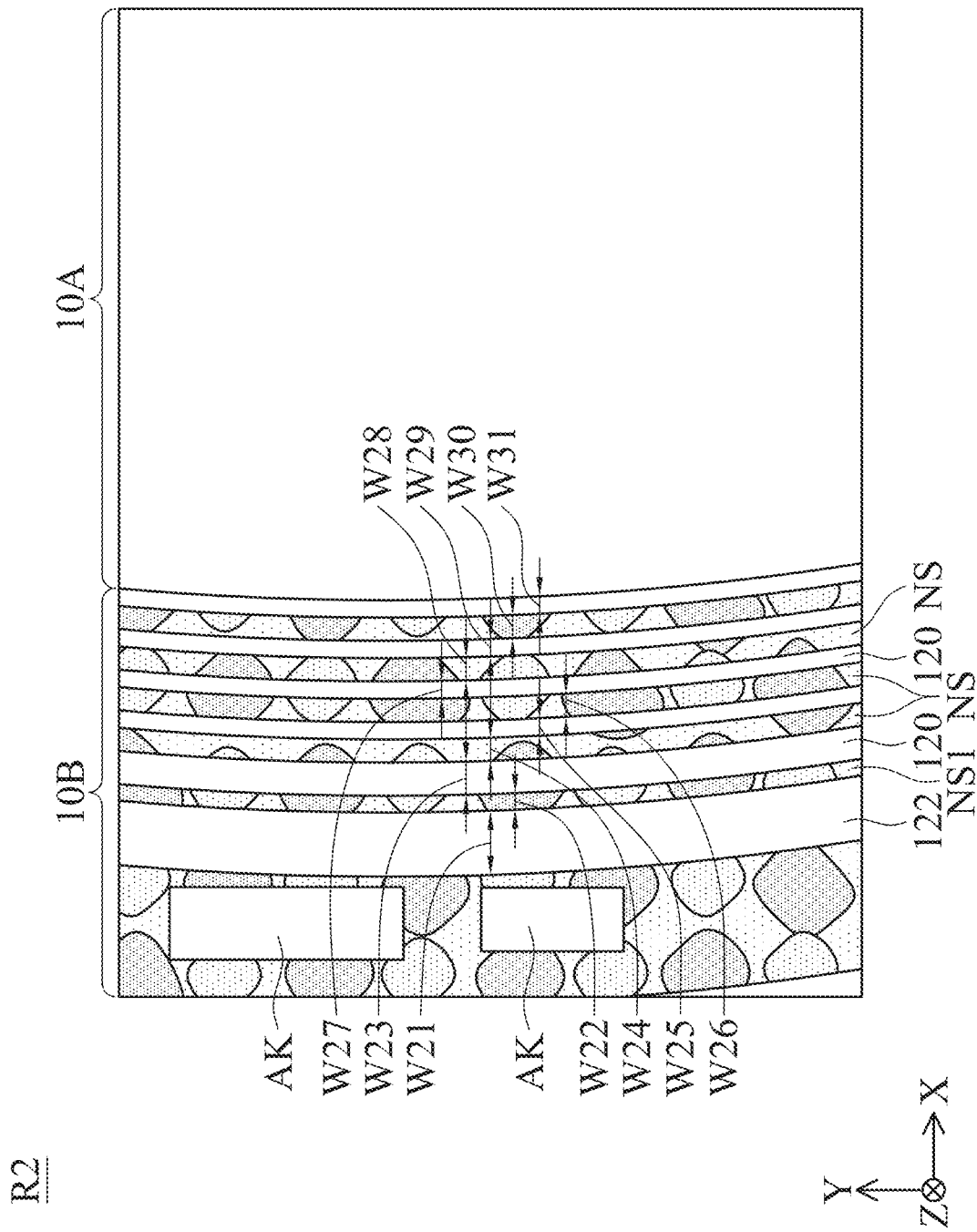

Next, refer to FIGS. 6A-6B, which are partially enlarged schematic diagrams of region R2 in FIG. 1 in some embodiments of the present disclosure. FIGS. 6A-6B show various aspects of the slits 120 and the dam structure 122 of the display panel. The slits 120 and the dam structure 122 disposed in the non-aperture region 10B, and the slits 120 may have various widths.

As shown in FIG. 6A, in some embodiments, the dam structure 122 has a width W1', and the slits 120 have a width W3', a width W5, a width W7, a width W9, a width W11, a width W13, and a width W15, respectively. The width W1' of the dam structure 122 is measured along a direction perpendicular to a local extending direction of the dam structure 122. The widths of the slits 120 (such as the width W3', the width W5, the width W7, the width W9, the width W11, the width W13, and the width W15) are respectively measured along a direction perpendicular to a local extending direction of the corresponding slit.

In addition, there is a non-slit portion NS1 between the dam structure 122 and the slit 120 adjacent to the dam structure 122, the non-slit portion NS1 has a width W2'. The non-slit portions NS between adjacent ones of the slits 120 have a width W4, a width W6, a width W8, a width W10, a width W12, and a width W14, respectively. The width W2' of the non-slit portion NS1, the widths of the non-slit portions NS (such as the width W4, the width W6, the width W8, the width W10, the width W12, and the width W14) are respectively measured along a direction perpendicular to a local extending direction of the corresponding non-slit portion.

In some embodiments, the width W1' of the dam structure 122, the widths of the slits 120, the width W2' of the non-slit portion NS1, and the widths of the non-slit portions NS may be the same or different. For example, the width W1', the width W2', the width W3', the width W4, the width W5, the width W6, the width W7, the width W8, the width W9, the width W10, the width W11, the width W12, the width W13, the width W14, and the width W15 may be 40.218 μm, 20.868 μm, 13.328 μm, 11.817 μm, 13.301 μm, 11.003 μm, 12.9 μm, 12.526 μm, 13.68 μm, 11.762 μm, 12.141 μm, 12.521 μm, 12.165 μm, 13.328 μm, and 12.165 μm, respectively, but it is not limited thereto.

As shown in FIG. 6B, in some other embodiments, the dam structure 122 has a width W21, and the slits 120 have a width W23, a width W25, a width W27, a width W29, and a width W31, respectively. The width W21 of the dam structure 122 is measured along a direction perpendicular to a local extending direction of the dam structure 122. The widths of the slits 120 (such as the width W23, the width W25, the width W27, the width W29 and the width W31) are respectively measured along a direction perpendicular to a local extending direction of the corresponding slit.

In addition, there is a non-slit portion NS1 between the dam structure 122 and the slit 120 adjacent to the dam structure 122, the non-slit portion NS1 has a width W22. The non-slit portions NS between adjacent ones of the slits 120 have a width W24, a width W26, a width W28, and a width W30, respectively. The width W22 of the non-slit portion NS1, and the widths of the non-slit portions NS (such as the width W24, the width W26, the width W28 and the width W30) are respectively measured along a direction perpendicular to a local extending direction of the corresponding non-slit portion. In some embodiments, the width W21, the width W22, the width W23, the width W24, the width W25, the width W26, the width W27, the width W28, the width W29, the width W30, and the width W31 may be 20.275 μm, 8.11 μm, 10.14 μm, 6.08 μm, 8.11 μm, 6.08 μm, 8.11 μm, 7.1 μm, 7.1 μm, 7.1 μm, and 6.08 μm, respectively, but it is not limited thereto.

To summarize the above, in some embodiments, the display panel includes a plurality of light absorbing patterns disposed in the non-aperture region of the non-display region, and the light absorbing patterns can absorb or reduce different colors of lights. With the configuration of the light absorbing patterns, the non-target lights of various wavelengths reaching the sensing element in the display device can be reduced. Therefore, the signal to noise ratio performance of the sensing element in the display device can be improved.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods or steps. In addition, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. An electronic device having a first portion and a second portion adjacent to the first portion, comprising:
   a sensing element configured to receive a light corresponding to the first portion; and
   a plurality of first patterns and a plurality of second patterns;
   wherein the plurality of first patterns and the plurality of second patterns are corresponding to the second portion and configured to absorb different colors of lights, and an area of one of the plurality of first patterns is different from an area of one of the plurality of second patterns.

2. The electronic device as claimed in claim 1, wherein a number of the plurality of first patterns is different from a number of the plurality of second patterns.

3. The electronic device as claimed in claim 1, wherein a number of the plurality of first patterns is the same as a number of the plurality of second patterns.

4. The electronic device as claimed in claim 1, wherein the plurality of first patterns and the plurality of second patterns are arranged in a staggered manner.

5. The electronic device as claimed in claim 1, further comprising a substrate having a plurality of concave structures adjacent to the first portion, wherein at least one of the plurality of first patterns overlaps one of the plurality of concave structures in a normal direction of the electronic device.

6. The electronic device as claimed in claim 5, wherein the one of the plurality of concave structures is a slit surrounding the first portion, and at least one of the second patterns overlaps the slit in the normal direction of the electronic device.

7. The electronic device as claimed in claim 6, further comprising a dam structure adjacent to the slit, and the slit is located between the first portion and the dam structure in the normal direction of the electronic device.

8. The electronic device as claimed in claim 1, wherein at least one of the plurality of first patterns comprises an organic material.

9. The electronic device as claimed in claim 1, wherein at least one of the plurality of second patterns comprises an organic material.

10. The electronic device as claimed in claim 1, wherein a ratio of a width of the second potion to a half of a width of the first portion is greater than or equal to 0.1 and less than or equal to 1.

11. The electronic device as claimed in claim 1, wherein one of the plurality of first patterns has different portions at different heights.

12. The electronic device as claimed in claim 1, wherein one of the plurality of second patterns has different portions at different heights.

13. The electronic device as claimed in claim 1, further comprising a plurality of third patterns corresponding to the second portion, wherein the plurality of first patterns, the plurality of second patterns and the plurality of third patterns absorb different colors of lights.

14. The electronic device as claimed in claim 1, further comprising a shielding pattern with a curved shape overlapping at least a part of the second portion.

15. The electronic device as claimed in claim 14, wherein a ratio of a width of an overlapping region that the shielding pattern overlaps the second portion to a width of the second portion is greater than or equal to 0.1 and less than or equal to 1.

* * * * *